United States Patent
Lee et al.

(10) Patent No.: US 11,538,407 B2
(45) Date of Patent: Dec. 27, 2022

(54) DISPLAY APPARATUS AND METHOD OF DRIVING DISPLAY PANEL USING THE SAME

(71) Applicant: SAMSUNG DISPLAY CO., LTD., Yongin-si (KR)

(72) Inventors: Hyojin Lee, Yongin-si (KR); Eunho Lee, Suwon-si (KR); Jinyoung Roh, Hwaseong-si (KR); Sehyuk Park, Seongnam-si (KR); Bong Hyun You, Seoul (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 49 days.

(21) Appl. No.: 16/739,875

(22) Filed: Jan. 10, 2020

(65) Prior Publication Data
US 2020/0243008 A1    Jul. 30, 2020

(30) Foreign Application Priority Data
Jan. 28, 2019 (KR) .......... 10-2019-0010817

(51) Int. Cl.
  *G09G 3/3233* (2016.01)
  *H01L 29/786* (2006.01)
  *G09G 3/3258* (2016.01)

(52) U.S. Cl.
CPC ......... *G09G 3/3233* (2013.01); *G09G 3/3258* (2013.01); *H01L 29/7869* (2013.01);
(Continued)

(58) Field of Classification Search
CPC ...... G09G 3/20; G09G 3/3225; G09G 3/3233; G09G 3/3258; G09G 3/3275;
(Continued)

(56) References Cited

U.S. PATENT DOCUMENTS

2016/0070294 A1* 3/2016 Chung ............... H03K 5/24
                                                    345/213
2017/0004766 A1* 1/2017 Cho .................. G09G 3/3266
(Continued)

FOREIGN PATENT DOCUMENTS

KR      10-1287202      7/2013
KR      10-2015-0146117     12/2015
(Continued)

*Primary Examiner* — Ifedayo B Iluyomade
(74) *Attorney, Agent, or Firm* — F. Chau & Associates, LLC

(57) ABSTRACT

A display apparatus includes a display panel displaying an image based on input image data, a driving controller determining a low frequency driving mode and a normal driving mode based on the input image data, a gate driver outputting a gate signal, a data driver outputting a data voltage, and a power voltage generator outputting power voltages. The driving controller is configured to generate a writing frame in which data is written in a pixel of the display panel and a holding frame in which the written data is maintained without writing data in the pixel in the low frequency driving mode. The driving controller is configured to operate at least one of the driving controller, the data driver, and the power voltage generator in a power reducing mode during the holding frame.

20 Claims, 14 Drawing Sheets

(52) U.S. Cl.
CPC ......... *H01L 29/78672* (2013.01); *G09G 2300/0408* (2013.01); *G09G 2300/0426* (2013.01); *G09G 2330/023* (2013.01); *G09G 2340/0435* (2013.01)

(58) Field of Classification Search
CPC ... G09G 2300/0426; G09G 2300/0408; G09G 2330/021; G09G 2330/023; G09G 2330/028; G09G 2340/0435; H01L 29/78672; H01L 29/7869
See application file for complete search history.

(56) References Cited

U.S. PATENT DOCUMENTS

| | | | |
|---|---|---|---|
| 2017/0076679 A1* | 3/2017 | Ou | G09G 3/3614 |
| 2017/0092178 A1* | 3/2017 | Lee | H01L 27/1251 |
| 2017/0116922 A1* | 4/2017 | Jung | G09G 3/3258 |
| 2017/0278475 A1* | 9/2017 | Im | G09G 3/3696 |
| 2018/0005580 A1* | 1/2018 | Kim | G09G 3/3258 |
| 2019/0041956 A1* | 2/2019 | Yu | G09G 3/3611 |
| 2019/0066622 A1* | 2/2019 | Lin | G09G 3/3688 |
| 2019/0197979 A1* | 6/2019 | Kim | G09G 3/3685 |

FOREIGN PATENT DOCUMENTS

| | | |
|---|---|---|
| KR | 10-2016-0017250 | 2/2016 |
| KR | 10-1897011 | 9/2018 |

* cited by examiner

DISPLAY APPARATUS AND METHOD OF DRIVING DISPLAY PANEL USING THE SAME

CROSS-REFERENCE TO RELATED APPLICATION

This application claims priority under 35 U.S.C. § 119 to Korean Patent Application No. 10-2019-0010817, filed on Jan. 28, 2019 in the Korean Intellectual Property Office (KIPO), the disclosure of which is incorporated by reference herein in its entirety.

TECHNICAL FIELD

Exemplary embodiments of the present inventive concept relate to a display apparatus and a method of driving a display panel using the display apparatus. More particularly, exemplary embodiments of the present inventive concept relate to a display apparatus capable of reducing power consumption and a method of driving a display panel using the display apparatus.

DISCUSSION OF RELATED ART

Generally, a display apparatus includes a display panel and a display panel driver. The display panel displays an image based on input image data. The display panel includes a plurality of gate lines, a plurality of data lines, and a plurality of pixels. The display panel driver includes a gate driver, a data driver, and a driving controller. The gate driver outputs gate signals to the plurality of gate lines. The data driver outputs data voltages to the plurality of data lines. The driving controller controls the gate driver and the data driver.

When the display panel is driven in a fixed frequency regardless of the input image data, the power consumption may be high. When the display panel is used in a mobile apparatus and the power consumption is high, a usage time of the mobile apparatus may be limited.

SUMMARY

According to an exemplary embodiment of the present inventive concept, a display apparatus includes a display panel, a driving controller, a gate driver, a data driver, and a power voltage generator. The display panel is configured to display an image based on input image data. The driving controller is configured to determine a low frequency driving mode and a normal driving mode based on the input image data. The gate driver is configured to output a gate signal to the display panel. The data driver is configured to output a data voltage to the display panel. The power voltage generator is configured to output power voltages to the driving controller, the gate driver, and the data driver. The driving controller is configured to generate a writing frame in which data is written in a pixel of the display panel and a holding frame in which the written data is maintained without writing data in the pixel in the low frequency driving mode. The driving controller is configured to operate at least one of the driving controller, the data driver, and the power voltage generator in a power reducing mode during the holding frame.

In an exemplary embodiment of the present inventive concept, the driving controller may include a receiver configured to receive the input image data and an input control signal, a frequency determiner configured to determine a driving frequency and the power reducing mode based on the input image data, a signal generator configured to generate a gate control signal for controlling the gate driver and a data control signal for controlling the data driver based on the driving frequency and the input control signal, and a data compensator configured to generate a data signal based on the driving frequency and the input control signal.

In an exemplary embodiment of the present inventive concept, an input buffer of the receiver may be configured to be turned off in the power reducing mode.

In an exemplary embodiment of the present inventive concept, the power voltage generator may be configured not to output at least one of the power voltages in the power reducing mode.

In an exemplary embodiment of the present inventive concept, the power voltage generator may be configured not to output some of the power voltages in a first power reducing mode. The power voltage generator may be configured not to output all of the power voltages in a second power reducing mode In an exemplary embodiment of the present inventive concept, the power voltage generator may include a first voltage generator configured to generate an oscillator voltage for operating an oscillator generating a clock signal of the driving controller, a second voltage generator configured to generate a logic voltage for operating the driving controller, a third voltage generator configured to generate a memory voltage for operating a memory used by the driving controller, a fourth voltage generator configured to generate a signal transmitting voltage for transmitting a signal between the driving controller and the data driver, and a fifth voltage generator configured to generate a data power voltage for operating the data driver.

In an exemplary embodiment of the present inventive concept, a first switch connected to the first voltage generator, a third switch connected to the third voltage generator, and a fifth switch connected to the fifth voltage generator may be configured to be open, and a second switch connected to the second voltage generator and a fourth switch connected to the fourth voltage generator may be configured to be closed in the first power reducing mode.

In an exemplary embodiment of the present inventive concept, a first switch connected to the first voltage generator, a second switch connected to the second voltage generator, a third switch connected to the third voltage generator, a fourth switch connected to the fourth voltage generator, and a fifth switch connected to the fifth voltage generator may be configured to be open in the second power reducing mode.

In an exemplary embodiment of the present inventive concept, an output buffer of the data driver may be configured to be turned off in the power reducing mode.

In an exemplary embodiment of the present inventive concept, the data driver may include a plurality of current sources connected to one another in parallel, a plurality of current switches respectively connected to the plurality of current sources in series, a first transistor connected to the plurality of current switches, and a second transistor connected to the first transistor and the output buffer. The plurality of current switches may be configured to be open in the power reducing mode.

In an exemplary embodiment of the present inventive concept, the driving controller may be configured to generate a synchronizing signal having an active pulse in the holding frame before the writing frame in the power reducing mode.

In an exemplary embodiment of the present inventive concept, the driving controller the driving controller may be configured to generate a synchronizing signal having a plurality of active pulses in the holding frame before the writing frame in the power reducing mode.

In an exemplary embodiment of the present inventive concept, the pixel may include a switching element of a first type and a switching element of a second type different from the first type.

In an exemplary embodiment of the present inventive concept, the switching element of the second type may be configured to be driven in a low driving frequency and the switching element of the first type may be configured to be driven in a first driving frequency greater than the low driving frequency in the low frequency driving mode.

In an exemplary embodiment of the present inventive concept, the switching element of the first type and the switching element of the second type may be configured to be driven in a normal driving frequency greater than the low driving frequency in the normal driving mode.

In an exemplary embodiment of the present inventive concept, the switching element of the first type may be a polysilicon thin film transistor. The switching element of the second type may be an oxide thin film transistor.

In an exemplary embodiment of the present inventive concept, the switching element of the first type may be a P-type transistor. The switching element of the second type may be an N-type transistor.

In an exemplary embodiment of the present inventive concept, the pixel may include a first pixel switching element including a control electrode connected to a first node, an input electrode connected to a second node, and an output electrode connected to a third node, a second pixel switching element including a control electrode configured to receive a first data write gate signal, an input electrode configured to receive the data voltage, and an output electrode connected to the second node, a third pixel switching element including a control electrode configured to receive a second data write gate signal, an input electrode connected to the first node, and an output electrode connected to the third node, a fourth pixel switching element including a control electrode configured to receive a data initialization gate signal, an input electrode configured to receive an initialization voltage, and an output electrode connected to the first node, a fifth pixel switching element including a control electrode configured to receive an emission signal, an input electrode configured to receive a high power voltage, and an output electrode connected to the second node, a sixth pixel switching element including a control electrode configured to receive the emission signal, an input electrode connected to the third node, and an output electrode connected to an anode electrode of an organic light emitting element, a seventh pixel switching element including a control electrode configured to receive an organic light emitting element initialization gate signal, an input electrode configured to receive the initialization voltage, and an output electrode connected to the anode electrode of the organic light emitting element, a storage capacitor including a first electrode configured to receive the high power voltage and a second electrode connected to the first node, and the organic light emitting element including the anode electrode connected to the output electrode of the sixth switching element and a cathode electrode configured to receive a low power voltage.

In an exemplary embodiment of the present inventive concept, the first pixel switching element, the second pixel switching element, the fifth pixel switching element, and the sixth pixel switching element may be polysilicon thin film transistors. The third pixel switching element and the fourth pixel switching element may be oxide thin film transistors.

According to an exemplary embodiment of the present inventive concept, a method of driving a display panel includes determining a low frequency driving mode and a normal driving mode based on input image data using a driving controller, outputting a gate signal to the display panel according to the low frequency driving mode and the normal driving mode using a gate driver, and outputting a data voltage to the display panel according to the low frequency driving mode and the normal driving mode using a data driver. The driving controller is configured to generate a writing frame in which data is written in a pixel of the display panel and a holding frame in which the written data is maintained without writing data in the pixel in the low frequency driving mode. The driving controller is configured to operate at least one of the driving controller, the data driver, and a power voltage generator in a power reducing mode during the holding frame.

According to an exemplary embodiment of the present inventive concept, a method of driving a display panel including a pixel includes receiving, by the pixel, a second data write gate signal and a date initialization gate signal, each having a first frequency, receiving, by the pixel, a first data write gate signal, an emission signal, and an organic light emitting element initialization signal, each having a second frequency greater than the first frequency, deactivating the emission signal periodically during an emission off duration, activating the first data write gate signal, the data initialization gate signal, the second data write signal, and the organic light emitting initialization signal during the emission off duration of a writing frame, and activating the first data write gate signal and the organic light emitting initialization signal during the emission off duration of a holding frame. The data initialization gate signal and the second data write gate signal remain inactivated during the emission off duration of the holding frame.

BRIEF DESCRIPTION OF THE DRAWINGS

The above and other features of the present inventive concept will become more apparent by describing in detailed exemplary embodiments thereof with reference to the accompanying drawings.

DETAILED DESCRIPTION OF THE EMBODIMENTS

Figure 1:
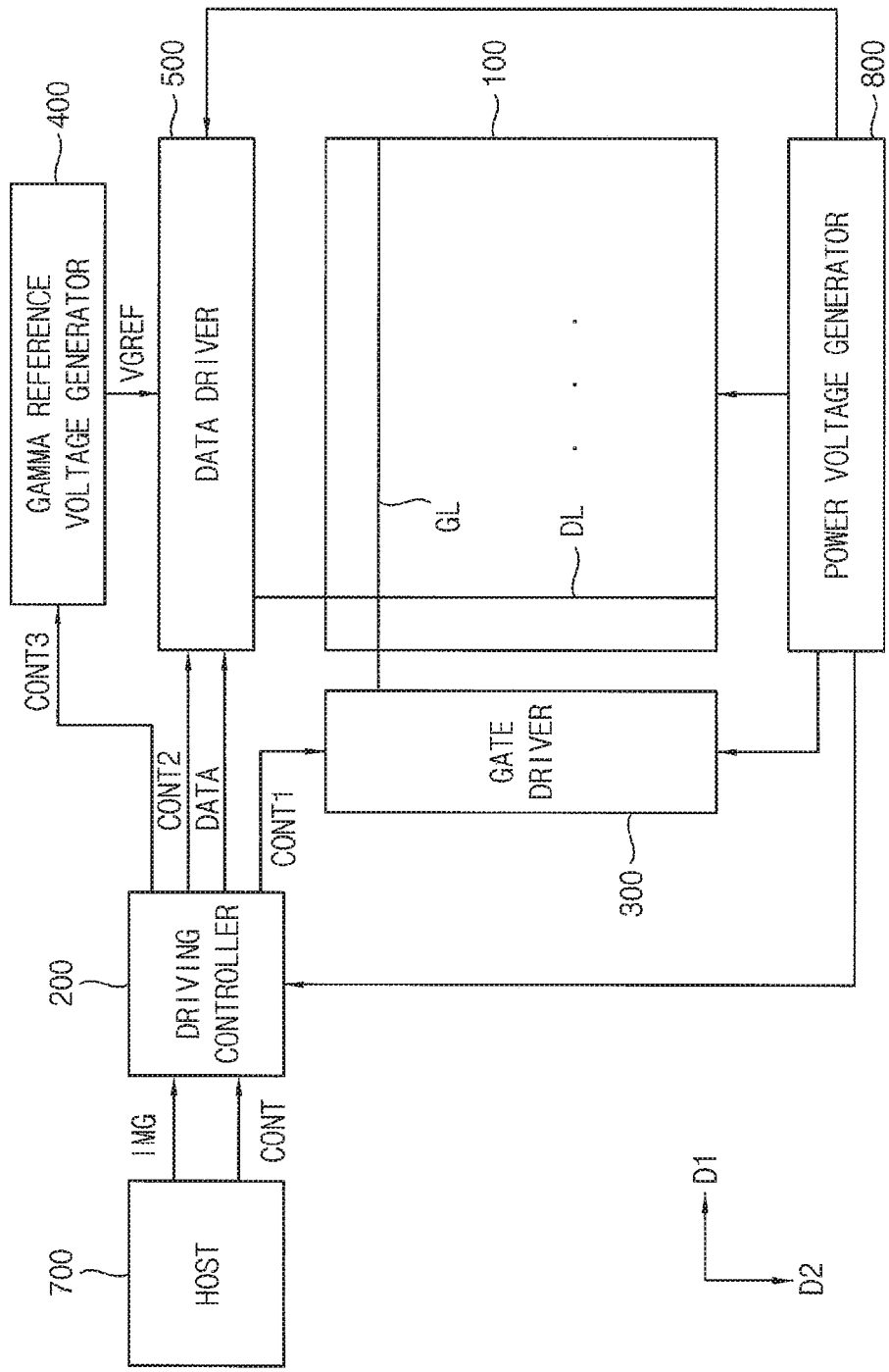
FIG. 1 is a block diagram illustrating a display apparatus according to an exemplary embodiment of the present inventive concept.

Exemplary embodiments of the present inventive concept provide a display apparatus operating a display panel driver in a power reducing mode during a holding frame of a low frequency driving mode.

Exemplary embodiments of the present inventive concept also provide a method of driving a display panel using the display apparatus.

Hereinafter, exemplary embodiments of the present inventive concept will be explained in detail with reference to the accompanying drawings. Like reference numerals may refer to like elements throughout this application.

FIG. 1 is a block diagram illustrating a display apparatus according to an exemplary embodiment of the present inventive concept.

Referring to FIG. 1, the display apparatus includes a display panel 100 and a display panel driver. The display panel driver includes a driving controller 200, a gate driver 300, a gamma reference voltage generator 400, and a data driver 500. The display apparatus may further include a host 700 and a power voltage generator 800.

For example, the driving controller 200 and the data driver 500 may be integrally formed. For example, the driving controller 200, the gamma reference voltage generator 400, and the data driver 500 may be integrally formed. For example, the driving controller 200, the gate driver 300, the gamma reference voltage generator 400, and the data driver 500 may be integrally formed. For example, the driving controller 200, the gate driver 300, the gamma reference voltage generator 400, the data driver 500, and the power voltage generator 800 may be integrally formed.

The display panel 100 has a display region on which an image is displayed and a peripheral region adjacent to the display region.

For example, the display panel 100 may be a liquid crystal display panel including liquid crystal molecules. Alternatively, the display panel 100 may be an organic light emitting diode display panel including organic light emitting diodes.

The display panel 100 includes a plurality of gate lines GL, a plurality of data lines DL and a plurality of pixels connected to the gate lines GL and the data lines DL. The gate lines GL extend in a first direction D1 and the data lines DL extend in a second direction D2 crossing the first direction D1.

The driving controller 200 receives input image data IMG and an input control signal CONT from the host 700. The input image data may include red image data, green image data, and blue image data. The input image data may include white image data. The input image data may also include magenta image data, yellow image data, and cyan image data. The input control signal CONT may include a master clock signal and a data enable signal. The input control signal CONT may also include a vertical synchronizing signal and a horizontal synchronizing signal.

The driving controller 200 generates a first control signal CONT1, a second control signal CONT2, a third control signal CONT3, and a data signal DATA based on the input image data IMG and the input control signal CONT.

The driving controller 200 generates the first control signal CONT1 for controlling an operation of the gate driver 300 based on the input control signal CONT, and outputs the first control signal CONT1 to the gate driver 300. The first control signal CONT1 may include a vertical start signal and a gate clock signal.

The driving controller 200 generates the second control signal CONT2 for controlling an operation of the data driver 500 based on the input control signal CONT, and outputs the second control signal CONT2 to the data driver 500. The second control signal CONT2 may include a horizontal start signal and a load signal.

The driving controller 200 generates the data signal DATA based on the input image data IMG. The driving controller 200 outputs the data signal DATA to the data driver 500.

The driving controller 200 generates the third control signal CONT3 for controlling an operation of the gamma reference voltage generator 400 based on the input control signal CONT, and outputs the third control signal CONT3 to the gamma reference voltage generator 400.

The gate driver 300 generates gate signals driving the gate lines GL in response to the first control signal CONT1 received from the driving controller 200. The gate driver 300 outputs the gate signals to the gate lines GL. For example, the gate driver 300 may sequentially output the gate signals to the gate lines GL.

The gamma reference voltage generator 400 generates a gamma reference voltage VGREF in response to the third control signal CONT3 received from the driving controller 200. The gamma reference voltage generator 400 provides the gamma reference voltage VGREF to the data driver 500. The gamma reference voltage VGREF has a value corresponding to a level of the data signal DATA.

In an exemplary embodiment of the present inventive concept, the gamma reference voltage generator 400 may be disposed in the driving controller 200, or in the data driver 500.

The data driver 500 receives the second control signal CONT2 and the data signal DATA from the driving controller 200, and receives the gamma reference voltages VGREF from the gamma reference voltage generator 400. The data driver 500 converts the data signal DATA into data voltages having an analog type using the gamma reference voltages VGREF. The data driver 500 outputs the data voltages to the data lines DL.

The host 700 may output the input image data IMG and the input control signal CONT to the driving controller 200.

The power voltage generator 800 outputs power voltages for the driving controller 200, the gate driver 300, and the data driver 500. For example, the power voltage generator 800 may generate a logic voltage of the driving controller 200. For example, the power voltage generator 800 may generate a gate on voltage and a gate off voltage of the gate driver 300. For example, the power voltage generator 800 may generate a data power voltage of the data driver 500. For example, the power voltage generator 800 may generate a common voltage and a storage voltage of the display panel 100.

Figure 2:
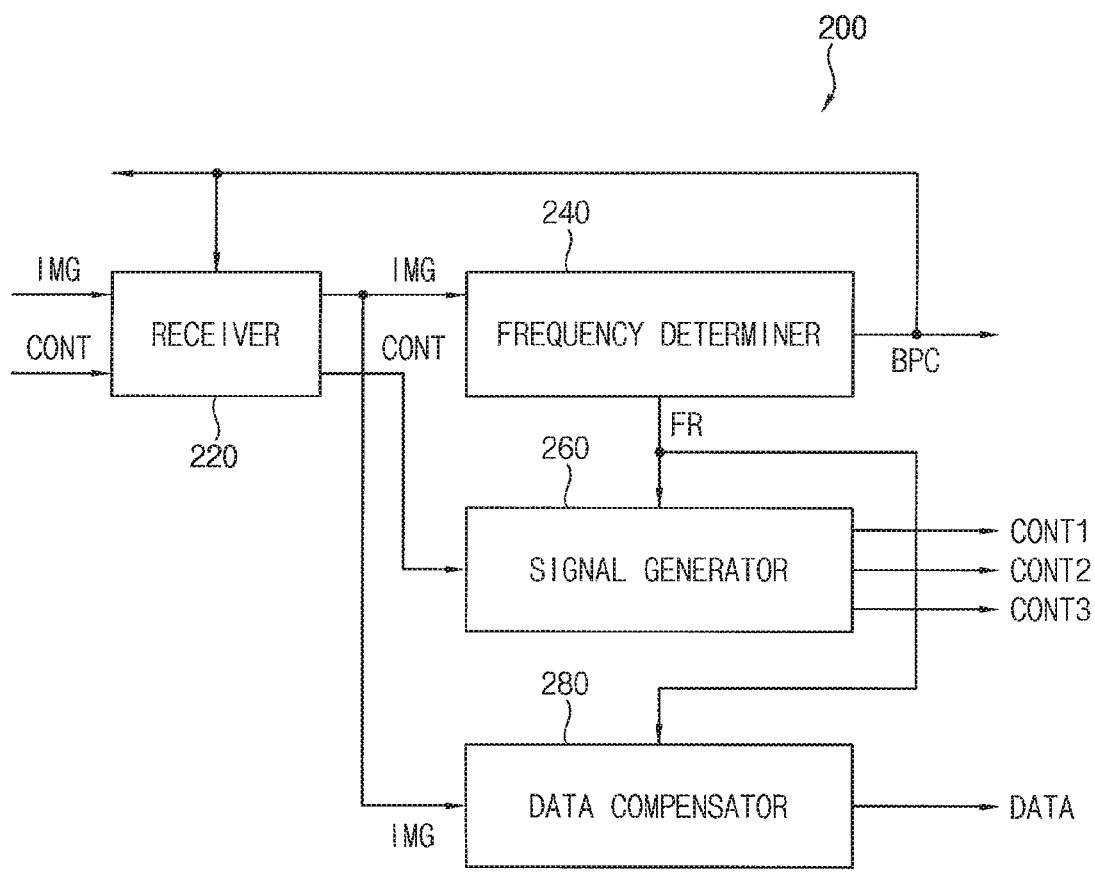
FIG. 2 is a block diagram illustrating a driving controller of FIG. 1 according to an exemplary embodiment of the present inventive concept.

FIG. 2 is a block diagram illustrating a driving controller of FIG. 1 according to an exemplary embodiment of the present inventive concept.

Referring to FIGS. 1 and 2, the driving controller 200 may include a receiver 220, a frequency determiner 240, a signal generator 260, and a data compensator 280.

The receiver 220 may receive the input image data IMG and the input control signal CONT from the host 700. The receiver 220 may output the input image data IMG to the frequency determiner 240 and the data compensator 280. The receiver 220 may output the input control signal CONT to the signal generator 260.

The frequency determiner 240 may determine a driving frequency FR of the display apparatus based on the input image data IMG. When the input image data IMG represents a video image, the driving frequency FR may be relatively high. When the input image data IMG represents a still image, the driving frequency FR may be relatively low.

The frequency determiner 240 may determine a low frequency driving mode and a normal driving mode based on the input image data IMG. For example, when the input image data IMG represents a video image, the frequency determiner 240 may drive the display apparatus in the normal driving mode. When the input image data IMG represents a still image, the frequency determiner 240 may drive the display apparatus in the low frequency driving mode.

In addition, the frequency determiner 240 may determine the low frequency driving mode and the normal driving mode based on an input mode of the display apparatus. For example, when the input mode of the display apparatus is Always On Mode, the frequency determiner 240 may drive the display apparatus in the low frequency driving mode.

The display panel 100 may be driven in units of frames. The display panel 100 may be refreshed in every frame in the normal driving mode. Thus, the normal driving mode includes only writing frames in which data is written in the pixel.

The display panel 100 may be refreshed in the frequency of the low frequency driving mode in the low frequency driving mode. Thus, the low frequency driving mode includes the writing frames in which the data is written in the pixel and holding frames in which the written data is maintained without writing the data in the pixel.

For example, when the frequency of the normal driving mode is 60 Hz and the frequency of the low frequency driving mode is 1 Hz, the low frequency driving mode includes one writing frame WRITE and fifty nine holding frames HOLD in a second. For example, when the frequency of the normal driving mode is 60 Hz and the frequency of the low frequency driving mode is 1 Hz, fifty nine continuous holding frames HOLD are disposed between two adjacent writing frames WRITE.

For example, when the frequency of the normal driving mode is 60 Hz and the frequency of the low frequency driving mode is 10 Hz, the low frequency driving mode includes ten writing frame WRITE and fifty holding frames HOLD in a second. For example, when the frequency of the normal driving mode is 60 Hz and the frequency of the low frequency driving mode is 10 Hz, five continuous holding frames HOLD are disposed between two adjacent writing frames WRITE.

When the driving mode of the display apparatus is the low frequency driving mode, the frequency determiner 240 may operate the display apparatus in a power reducing mode. When the driving mode of the display apparatus is the low frequency driving mode, the frequency determiner 240 may generate a power reducing signal BPC representing the power reducing mode.

The frequency determiner 240 may output the driving frequency FR to the signal generator 260 and the data compensator 280.

The frequency determiner 240 may output the power reducing signal BPC to at least one of the receiver 220, the data driver 500, the host 700, and the power voltage generator 800.

The signal generator 260 may generate the first control signal CONT1 to control an operation of the gate driver 300 based on the input control signal CONT and the driving frequency FR and output the first control signal CONT1 to the gate driver 300. The signal generator 260 may generate the second control signal CONT2 to control an operation of the data driver 500 based on the input control signal CONT and the driving frequency FR and output the second control signal CONT2 to the data driver 500. The signal generator 260 may generate the third control signal CONT3 to control an operation of the gamma reference voltage generator 400 based on the input control signal CONT and the driving frequency FR and output the third control signal CONT3 to the gamma reference voltage generator 400.

The data compensator 280 may generate the data signal DATA based on the input image data IMG and the driving frequency FR and output the data signal DATA to the data driver 500. The data compensator 280 may compensate the input image data IMG to generate the data signal DATA. For example, the data compensator 280 may operate adaptive color correction using a gamma curve. For example, the data compensator 280 may operate dynamic capacitance compensation for compensating present frame data using previous frame data and the present frame data.

Figure 3A:
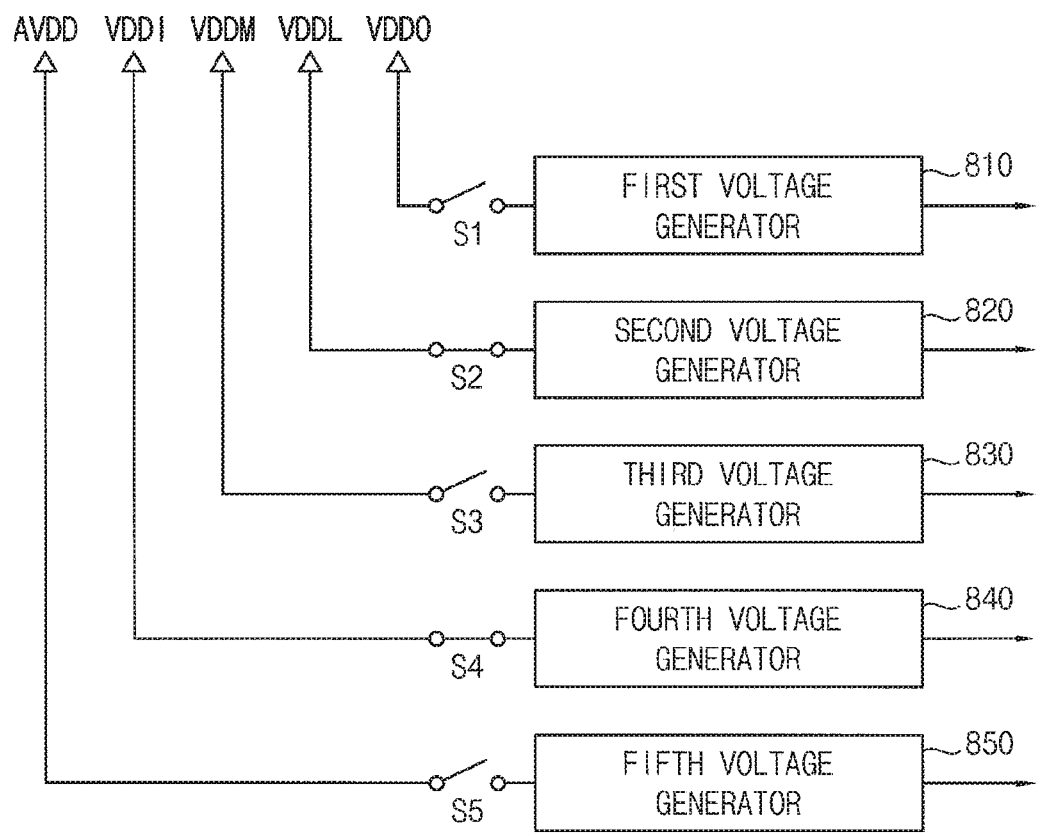
FIG. 3A is a conceptual diagram illustrating an operation of a power voltage generator of FIG. 1 in a first power reducing mode according to an exemplary embodiment of the present inventive concept.

FIG. 3A is a conceptual diagram illustrating an operation of a power voltage generator of FIG. 1 in a first power reducing mode according to an exemplary embodiment of the present inventive concept.

Referring to FIGS. 1 to 3A, the power voltage generator 800 may receive the power reducing signal BPC from the frequency determiner 240 of the driving controller 200.

In the power reducing mode, the power voltage generator 800 may not output at least one of the power voltages. As shown in FIG. 3A, the power voltage generator 800 may be operated in the first power reducing mode. In the first power reducing mode, the power voltage generator 800 may not output some of the power voltages.

For example, the power voltage generator 800 may include a first voltage generator 810, a second voltage generator 820, a third voltage generator 830, a fourth voltage generator 840, and a fifth voltage generator 850. The first voltage generator 810 may generate an oscillator voltage VDDO for operating an oscillator generating a clock signal of the driving controller 200. The second voltage generator 820 may generate a logic voltage VDDL for operating the driving controller 200. The third voltage generator 830 may generate a memory voltage VDDM for operating a memory. The fourth voltage generator 840 may generate a signal transmitting voltage VDDI for transmitting a signal between the driving controller 200 and the data driver 500. The fifth voltage generator 850 may generate a data power voltage AVDD for operating the data driver 500. For example, the memory may store the input image data IMG for operation of the data compensator 280. For example, the memory may be a frame memory. The signal transmitting voltage VDDI may be a voltage to transmit the signal in a differential mode.

For example, the oscillator voltage VDDO, the logic voltage VDDL, the memory voltage VDDM, and the signal transmitting voltage VDDI may have a digital level. For example, the data power voltage AVDD may have an analog level which is greater than the digital level. For example, at least two of the oscillator voltage VDDO, the logic voltage VDDL, the memory voltage VDDM, and the signal transmitting voltage VDDI may have substantially the same level. When at least two of the oscillator voltage VDDO, the logic voltage VDDL, the memory voltage VDDM, and the signal transmitting voltage VDDI have substantially the same level, the first to fourth power voltage generator 810, 820, 830, and 840 may be integrated in a single block.

In the first power reducing mode, a first switch S1 connected to the first voltage generator 810, a third switch S3 connected to the third voltage generator 830, and a fifth switch S5 connected to the fifth voltage generator 850 may be open. In the first power reducing mode, a second switch S2 connected to the second voltage generator 820 and a fourth switch S4 connected to the fourth voltage generator 840 may be closed.

Figure 3B:
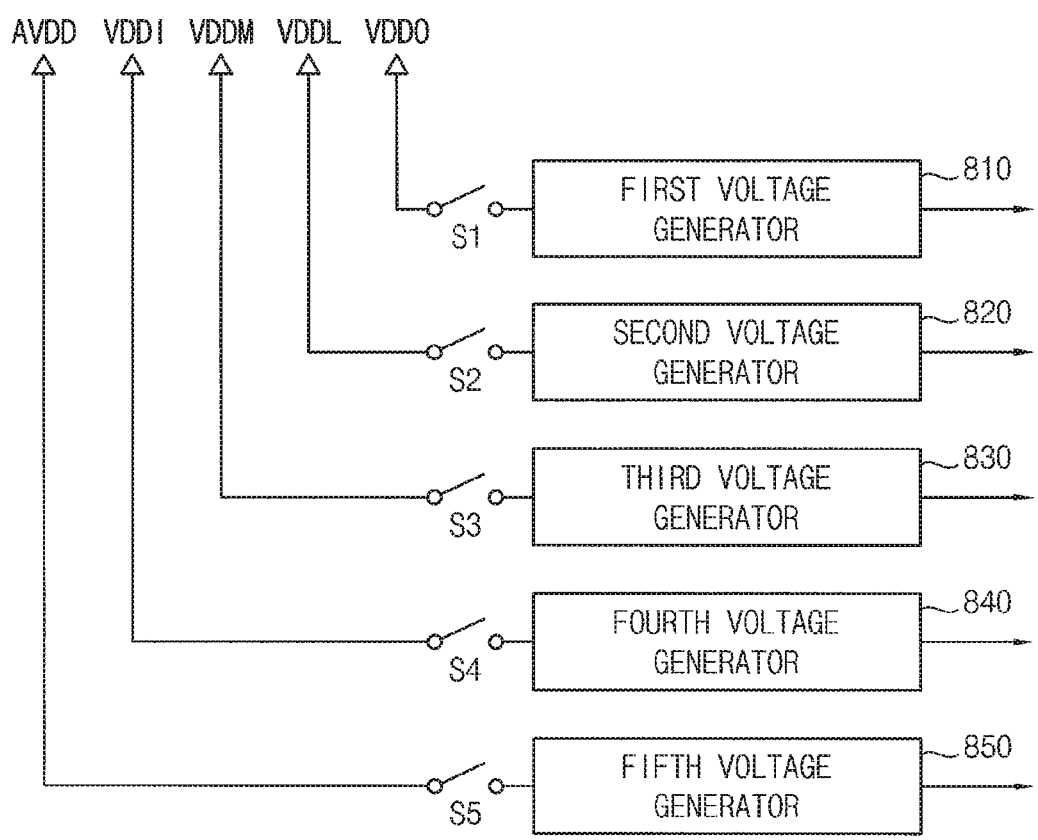
FIG. 3B is a conceptual diagram illustrating an operation of the power voltage generator of FIG. 1 in a second power reducing mode according to an exemplary embodiment of the present inventive concept.

FIG. 3B is a conceptual diagram illustrating an operation of the power voltage generator of FIG. 1 in a second power reducing mode according to an exemplary embodiment of the present inventive concept.

Referring to FIGS. 1 to 3B, in the power reducing mode, the power voltage generator 800 may not output all of the power voltages. As shown in FIG. 3B, the power voltage generator 800 may be operated in the second power reducing mode. In the second power reducing mode, the power voltage generator 800 may not output all of the power voltages.

In the second power reducing mode, the first switch S1 connected to the first voltage generator 810, the second switch S2 connected to the second voltage generator 820, the third switch S3 connected to the third voltage generator 830, the fourth switch S4 connected to the fourth voltage generator 840, and the fifth switch S5 connected to the fifth voltage generator 850 may be open.

Figure 4:
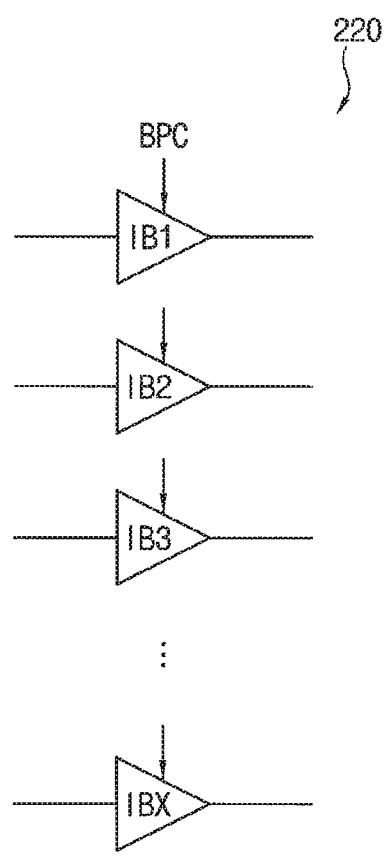
FIG. 4 is a conceptual diagram illustrating an operation of a receiver of a driving controller of FIG. 1 in a power reducing mode according to an exemplary embodiment of the present inventive concept.

FIG. 4 is a conceptual diagram illustrating an operation of a receiver of the driving controller of FIG. 1 in a power reducing mode according to an exemplary embodiment of the present inventive concept.

Referring to FIGS. 1, 2, and 4, the operation of the receiver 220 may be deactivated in the power reducing mode.

For example, the receiver 220 may include a plurality of input buffers IB1 to IBX for receiving the input image data IMG. The input buffers IB1 to IBX of the receiver 220 may be turned off in the power reducing mode. For example, the input buffers IB1 to IBX of the receiver 220 may be turned off in response to the power reducing signal BPC.

In addition, when the receiver 220 is deactivated in the power reducing mode, the host 700 may not output the input image data IMG to the receiver 220. For example, the host 700 may not output the input image data IMG to the receiver 220 in response to the power reducing signal BPC received from the frequency determiner 240.

Figure 5:
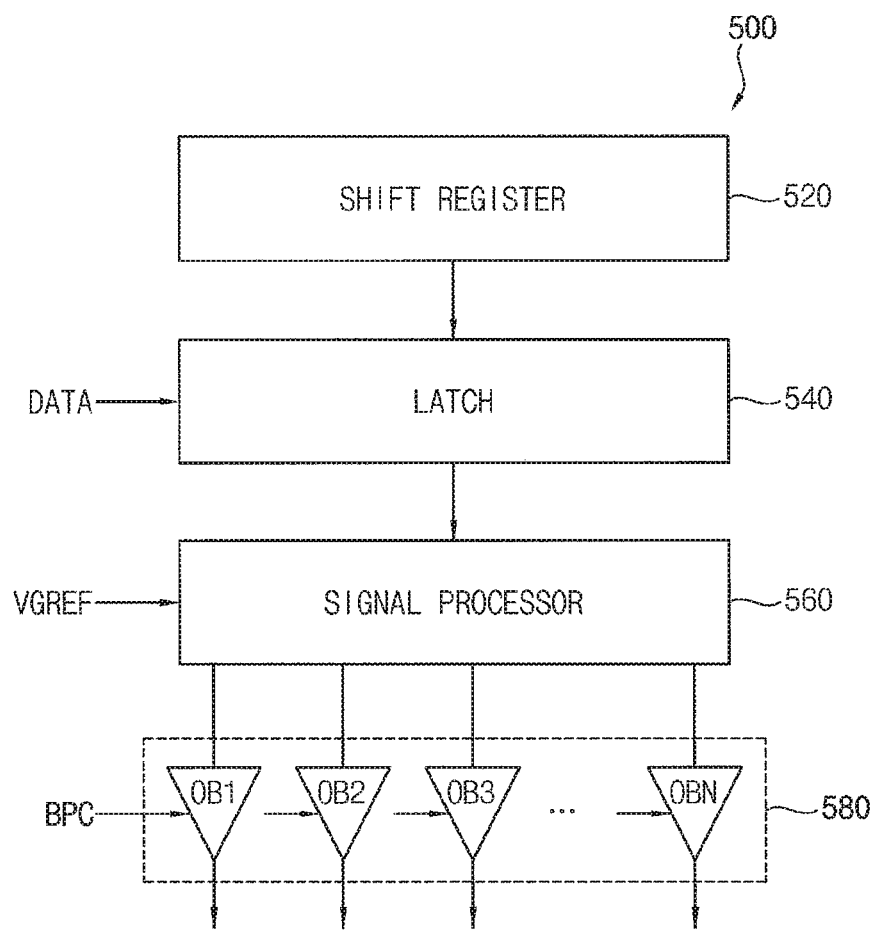
FIG. 5 is a conceptual diagram illustrating an operation of a data driver of FIG. 1 in the power reducing mode according to an exemplary embodiment of the present inventive concept.
Figure 6:
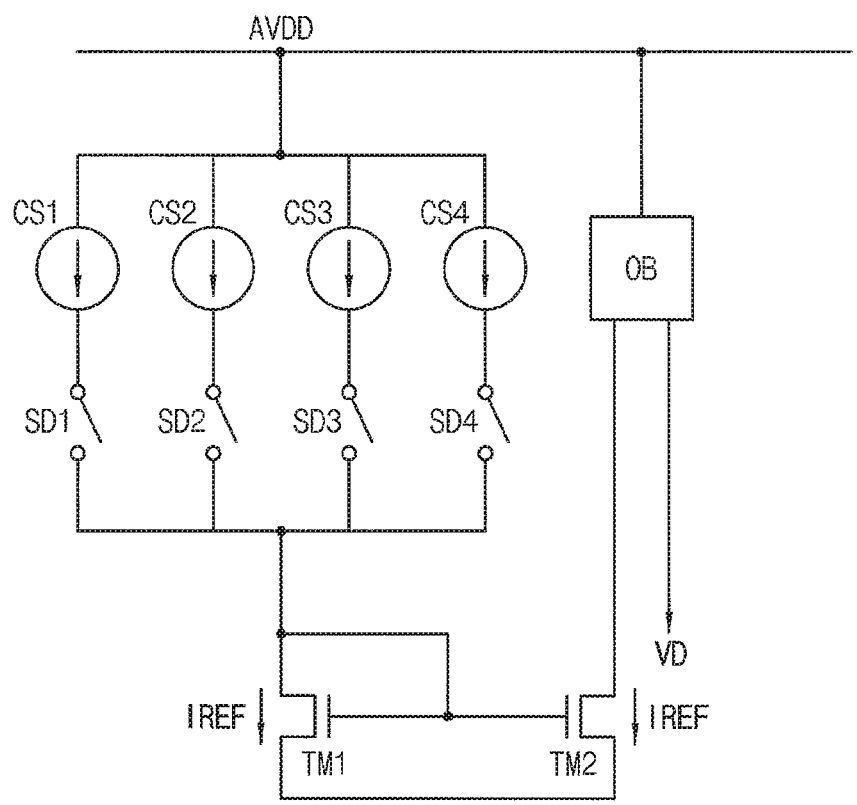
FIG. 6 is a circuit diagram illustrating an operation of an output buffer of FIG. 5 in the power reducing mode according to an exemplary embodiment of the present inventive concept.

FIG. 5 is a conceptual diagram illustrating an operation of a data driver of FIG. 1 in the power reducing mode according to an exemplary embodiment of the present inventive concept. FIG. 6 is a circuit diagram illustrating an operation of an output buffer of FIG. 5 in the power reducing mode according to an exemplary embodiment of the present inventive concept.

Referring to FIGS. 1, 2, 5, and 6, the data driver 500 may include a shift register 520, a latch 540, a signal processor 560, and a buffer 580.

The shift register 520 outputs a latch pulse to the latch 540.

The latch 540 temporarily stores the data signal DATA and outputs the data signal DATA.

The signal processor 560 converts the data signal DATA having a digital type to the data voltage having an analog type based on the data signal DATA and the gamma reference voltage generator VGREF. The signal processor 560 outputs the data voltage. For example, the signal processor 560 may include a first digital to analog converter converting the data signal DATA to a data voltage of a first polarity and a second digital to analog converter converting the data signal DATA to a data voltage of a second polarity opposite to the first polarity.

The buffer 580 buffers the data voltage outputted from the signal processor 560 and outputs the data voltage. The buffer 580 may include a plurality of output buffers OB1 to OBN outputting the data voltage to the data lines.

The operation of the data driver 500 may be deactivated in the power reducing mode. For example, the output buffers OB1 to OBN of the buffer 580 may be turned off in the power reducing mode. For example, the output buffers OB1 to OBN of the buffer 580 may be turned off in response to the power reducing signal BPC.

As shown in FIG. 6, the data driver 500 may include a plurality of current sources CS1, CS2, CS3, and CS4 connected to one another in parallel, a plurality of current switches SD1, SD2, SD3, and SD4 respectively connected to the current sources CS1, CS2, CS3, and CS4 in series, a first transistor TM1 connected to the current switches SD1, SD2, SD3, and SD4, and a second transistor TM2 connected to the first transistor TM1 and an output buffer OB.

The current sources CS1, CS2, CS3, and CS4, the current switches SD1, SD2, SD3, and SD4, the first transistor TM1, and the second transistor TM2 may form a current mirror circuit.

For example, at least one of the current switches SD1, SD2, SD3, and SD4 may be open in the power reducing mode. For example, all of the current switches SD1, SD2, SD3, and SD4 may be open in the power reducing mode. When the current switches SD1, SD2, SD3, and SD4 are open, the data voltage VD may not be outputted from the output buffer OB.

According to an exemplary embodiment of the present inventive concept, the current mirror circuit may be commonly connected to the output buffers OB1 to OBN of FIG. 5.

Figure 7:
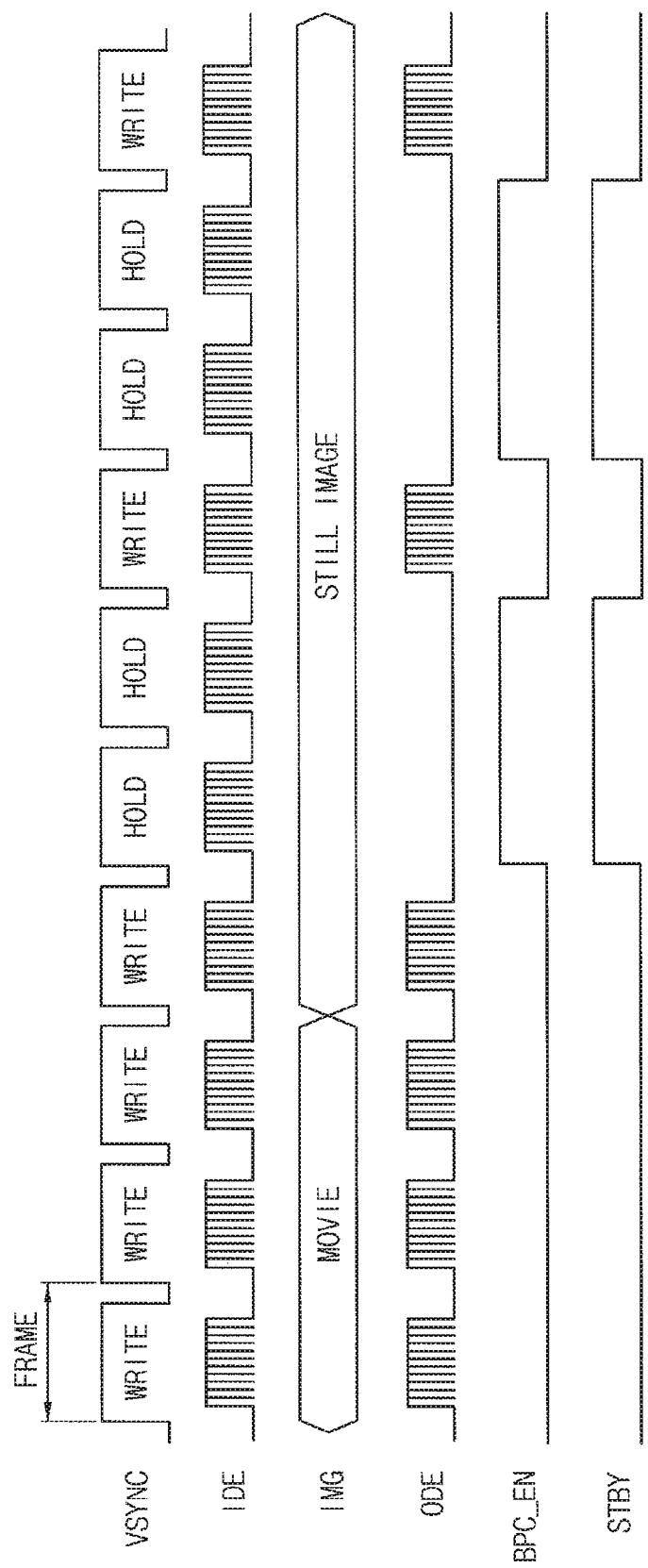
FIG. 7 is a timing diagram illustrating an operation of the driving controller of FIG. 1 according to input image data according to an exemplary embodiment of the present inventive concept.

FIG. 7 is a timing diagram illustrating an operation of the driving controller of FIG. 1 according to input image data according to an exemplary embodiment of the present inventive concept.

Referring to FIGS. 1 to 7, when the input image data IMG represents the video image, the driving controller 200 operates the display apparatus in the normal driving mode. In the normal driving mode, data are written to the pixel of the display panel in every frame. The frame may be defined by a duration between adjacent rising edges of a vertical synchronizing signal VSYNC.

In the normal driving mode, an input data enable signal IDE may be activated in every frame and an output data enable signal ODE may be activated in every frame.

In the normal driving mode, the power reducing signal BPC_EN has an inactive level and the display apparatus is not operated in the power reducing mode (e.g. a standby mode STBY).

When the input image data IMG represents the still image, the driving controller 200 operates the display apparatus in the low frequency driving mode. In the low frequency driving mode, data may not be written to the pixel of the display panel in every frame. For example, when the driving frequency in the normal driving mode is 60 Hz and the driving frequency of the low frequency driving mode is 20 Hz, a frame among three adjacent frames may be a writing frame and two other frames among the three adjacent frames may be holding frames.

In the low frequency driving mode, the input data enable signal IDE may be activated in every frame and the output data enable signal ODE may be activated only in the writing frame. In the low frequency driving mode, the output data enable signal ODE may be deactivated in the holding frame.

In the low frequency driving mode, the power reducing signal BPC_EN has an active level and the display apparatus is operated in the power reducing mode (e.g. the standby mode STBY). Although the active level of the power reducing signal BPC_EN and an active level of the power reducing mode STBY are a high level in FIG. 7, the present inventive concept is not limited thereto.

According to the present exemplary embodiment, at least one of the receiver 220 of the driving controller 200, the output buffer OB of the data driver 500, and the power voltage generator 800 is operated in the power reducing mode during the holding frame of the low frequency driving mode so that the power consumption of the display apparatus may be reduced.

Figure 8:
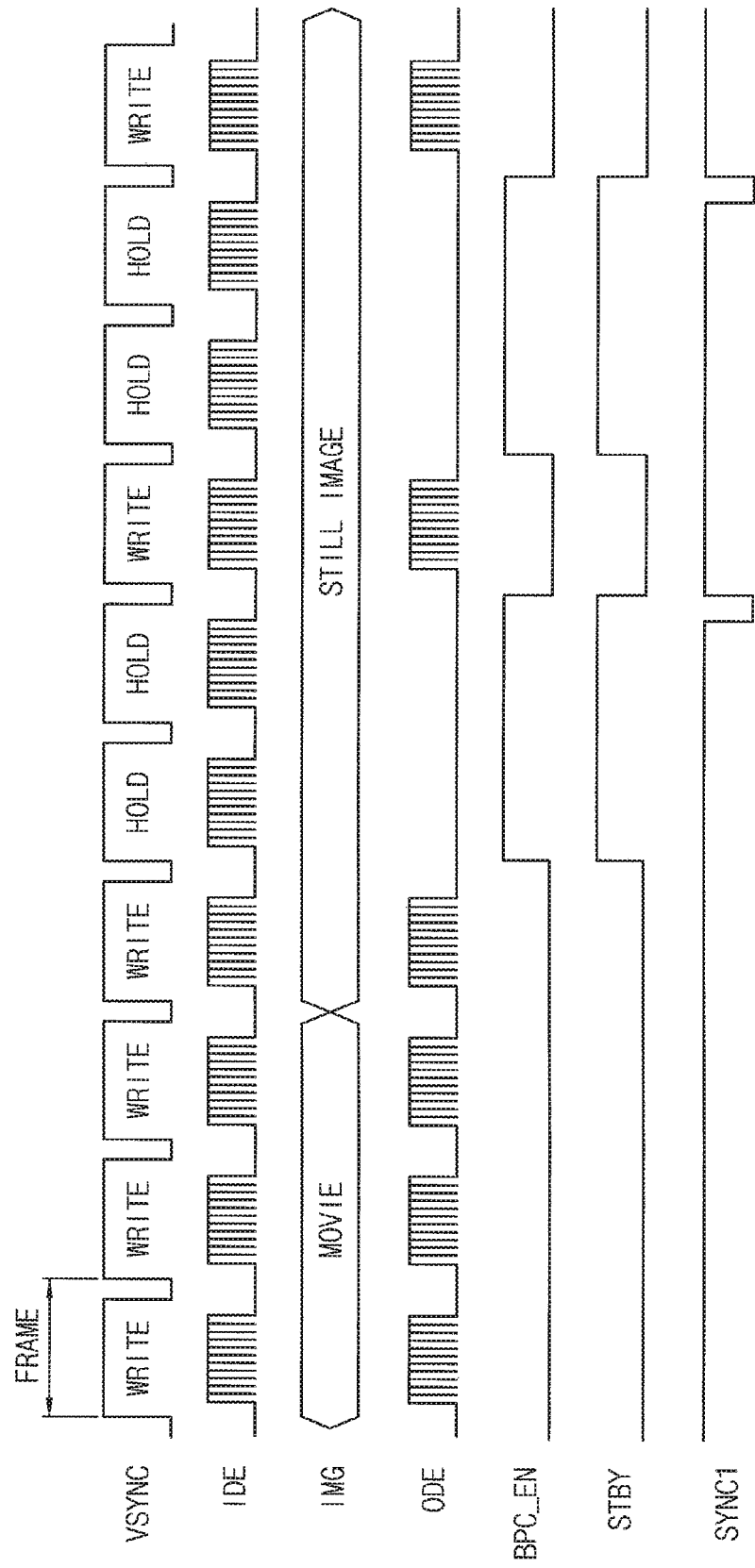
FIG. 8 is a timing diagram illustrating an operation of a driving controller of a display apparatus according to input image data according to an exemplary embodiment of the present inventive concept.

FIG. 8 is a timing diagram illustrating an operation of a driving controller of a display apparatus according to input image data according to an exemplary embodiment of the present inventive concept.

The display apparatus and the method of driving the display panel according to the present exemplary embodiment is substantially the same as the display apparatus and the method of driving the display panel of the exemplary embodiment described with reference to FIGS. 1 to 7, except for the signal generated by the driving controller. Thus, the same reference numerals will be used to refer to the same or like parts as those described in the exemplary embodiment of FIGS. 1 to 7 and any repetitive explanation concerning the above elements will be omitted.

Referring to FIGS. 1 to 6 and 8, the display apparatus includes the display panel 100 and the display panel driver. The display panel driver includes the driving controller 200, the gate driver 300, the gamma reference voltage generator 400, and the data driver 500. The display apparatus may further include the host 700. The display apparatus may further include the power voltage generator 800.

The driving controller 200 may include the receiver 220, the frequency determiner 240, the signal generator 260, and the data compensator 280.

The frequency determiner 240 may determine the driving frequency FR of the display apparatus based on the input image data IMG. When the input image data IMG represents a video image, the driving frequency FR may be relatively high. When the input image data IMG represents a still image, the driving frequency FR may be relatively low.

The frequency determiner 240 may determine a low frequency driving mode and a normal driving mode based on the input image data IMG. For example, when the input image data IMG represents a video image, the frequency determiner 240 may drive the display apparatus in the normal driving mode. For example, when the input image data IMG represents a still image, the frequency determiner 240 may drive the display apparatus in the low frequency driving mode.

In the power reducing mode, the power voltage generator 800 may not output at least one of the power voltages. Alternatively, in the power reducing mode, the power voltage generator 800 may not output all of the power voltages. The operation of the receiver 220 may be deactivated in the power reducing mode. For example, the input buffers IB1 to IBX of the receiver 220 may be turned off in the power reducing mode. The operation of the data driver 500 may be deactivated in the power reducing mode. For example, the output buffers OB1 to OBN of the buffer 580 may be turned off in the power reducing mode.

When the input image data IMG represents the video image, the driving controller 200 operates the display apparatus in the normal driving mode. In the normal driving mode, the data are written to the pixel of the display panel in every frame.

When the input image data IMG represents the still image, the driving controller 200 operates the display apparatus in the low frequency driving mode. In the low frequency driving mode, the data may not be written to the pixel of the display panel in every frame. For example, when the driving frequency in the normal driving mode is 60 Hz and the driving frequency of the low frequency driving mode is 20 Hz, a frame among three adjacent frames may be a writing frame and two other frames among the three adjacent frames may be holding frames.

In the low frequency driving mode, the input data enable signal IDE may be activated in every frame and the output data enable signal ODE may be activated only in the writing frame. In the low frequency driving mode, the output data enable signal ODE may be deactivated in the holding frame.

In the low frequency driving mode, the power reducing signal BPC_EN has an active level and the display apparatus is operated in the power reducing mode (e.g. the standby mode STBY).

In the present exemplary embodiment, the driving controller 200 may generate a synchronizing signal SYNC1 having an active pulse in the holding frame right before the writing frame in the power reducing mode STBY. Although the active pulse of the synchronizing signal SYNC1 has a low level in FIG. 8, the present inventive concept is not limited thereto.

According to the present exemplary embodiment, at least one of the receiver 220 of the driving controller 200, the output buffer OB of the data driver 500, and the power voltage generator 800 is operated in the power reducing mode during the holding frame of the low frequency driving mode so that the power consumption of the display apparatus may be reduced.

Figure 9:
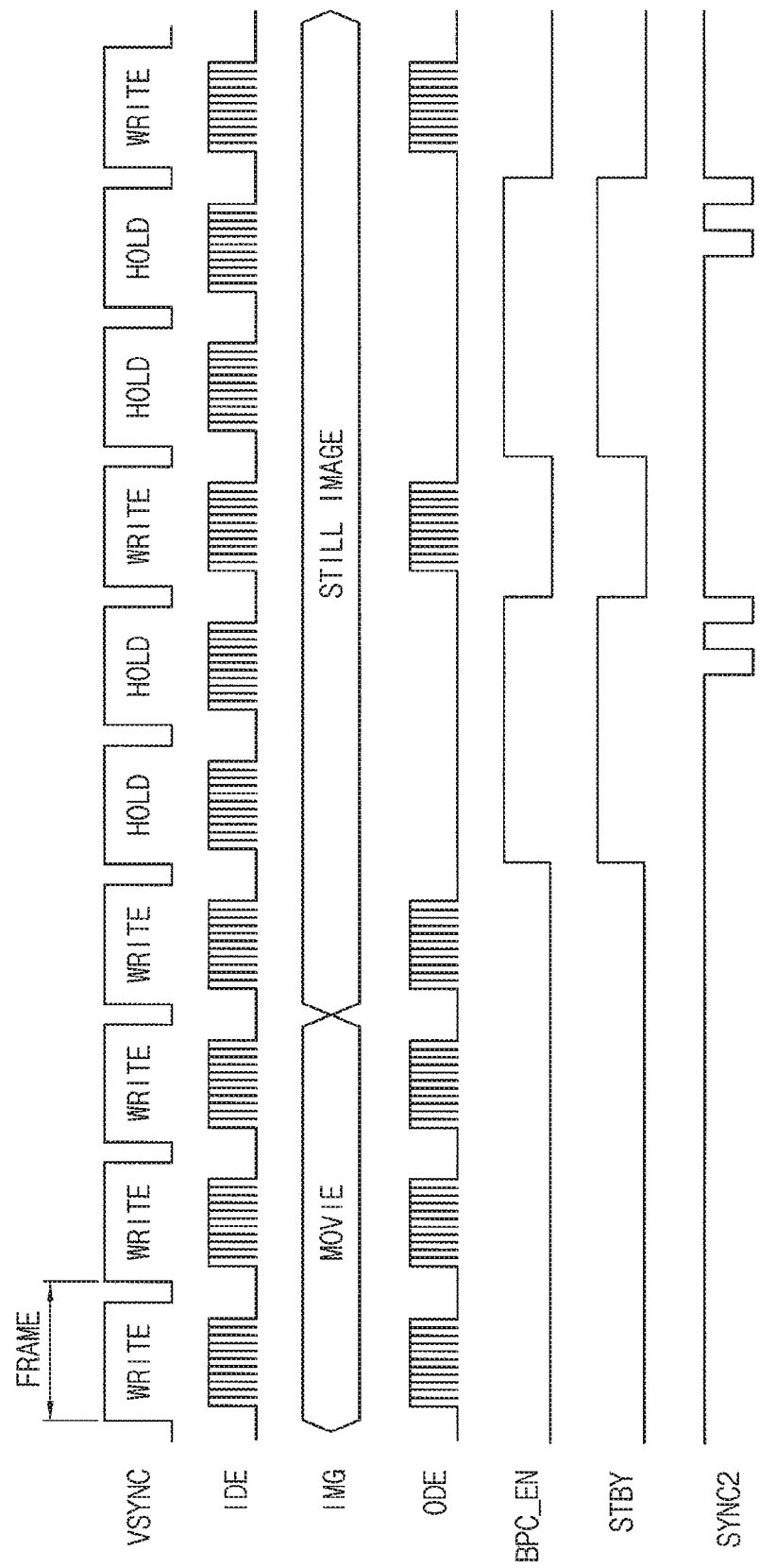
FIG. 9 is a timing diagram illustrating an operation of a driving controller of a display apparatus according to input image data according to an exemplary embodiment of the present inventive concept.

FIG. 9 is a timing diagram illustrating an operation of a driving controller of a display apparatus according to input image data according to an exemplary embodiment of the present inventive concept.

The display apparatus and the method of driving the display panel according to the present exemplary embodiment is substantially the same as the display apparatus and the method of driving the display panel of the exemplary embodiment described with reference to FIGS. 1 to 7, except for the signal generated by the driving controller. Thus, the same reference numerals will be used to refer to the same or like parts as those described in the exemplary embodiment of FIGS. 1 to 7 and any repetitive explanation concerning the above elements will be omitted.

Referring to FIGS. 1 to 6 and 9, the display apparatus includes the display panel 100 and the display panel driver. The display panel driver includes the driving controller 200, the gate driver 300, the gamma reference voltage generator 400, and the data driver 500. The display apparatus may further include the host 700. The display apparatus may further include the power voltage generator 800.

The driving controller 200 may include the receiver 220, the frequency determiner 240, the signal generator 260, and the data compensator 280.

The frequency determiner 240 may determine the driving frequency FR of the display apparatus based on the input image data IMG. When the input image data IMG represents a video image, the driving frequency FR may be relatively high. When the input image data IMG represents a still image, the driving frequency FR may be relatively low.

The frequency determiner 240 may determine a low frequency driving mode and a normal driving mode based on the input image data IMG. For example, when the input image data IMG represents a video image, the frequency determiner 240 may drive the display apparatus in the normal driving mode. For example, when the input image data IMG represents a still image, the frequency determiner 240 may drive the display apparatus in the low frequency driving mode.

In the power reducing mode, the power voltage generator 800 may not output at least one of the power voltages. Alternatively, in the power reducing mode, the power voltage generator 800 may not output all of the power voltages. The operation of the receiver 220 may be deactivated in the power reducing mode. For example, the input buffers IB1 to IBX of the receiver 220 may be turned off in the power reducing mode. The operation of the data driver 500 may be deactivated in the power reducing mode. For example, the output buffers OB1 to OBN of the buffer 580 may be turned off in the power reducing mode.

When the input image data IMG represents the video image, the driving controller 200 operates the display apparatus in the normal driving mode. In the normal driving mode, the data are written to the pixel of the display panel in every frame.

When the input image data IMG represents the still image, the driving controller 200 operates the display apparatus in the low frequency driving mode. In the low frequency driving mode, the data may not be written to the pixel of the display panel in every frame. For example, when the driving frequency in the normal driving mode is 60 Hz and the driving frequency of the low frequency driving mode is 20 Hz, a frame among three adjacent frames may be a writing frame and two other frames among the three adjacent frames may be holding frames.

In the low frequency driving mode, the input data enable signal IDE may be activated in every frame and the output data enable signal ODE may be activated only in the writing frame. In the low frequency driving mode, the output data enable signal ODE may be deactivated in the holding frame.

In the low frequency driving mode, the power reducing signal BPC_EN has an active level and the display apparatus is operated in the power reducing mode (e.g. the standby mode STBY).

In the present exemplary embodiment, the driving controller 200 may generate a synchronizing signal SYNC2 having a plurality of active pulses in the holding frame right before the writing frame in the power reducing mode STBY. Although the active pulse of the synchronizing signal SYNC2 has a low level in FIG. 9, the present inventive concept is not limited thereto.

According to the present exemplary embodiment, at least one of the receiver 220 of the driving controller 200, the output buffer OB of the data driver 500, and the power voltage generator 800 is operated in the power reducing mode during the holding frame of the low frequency driving mode so that the power consumption of the display apparatus may be reduced.

Figure 10:
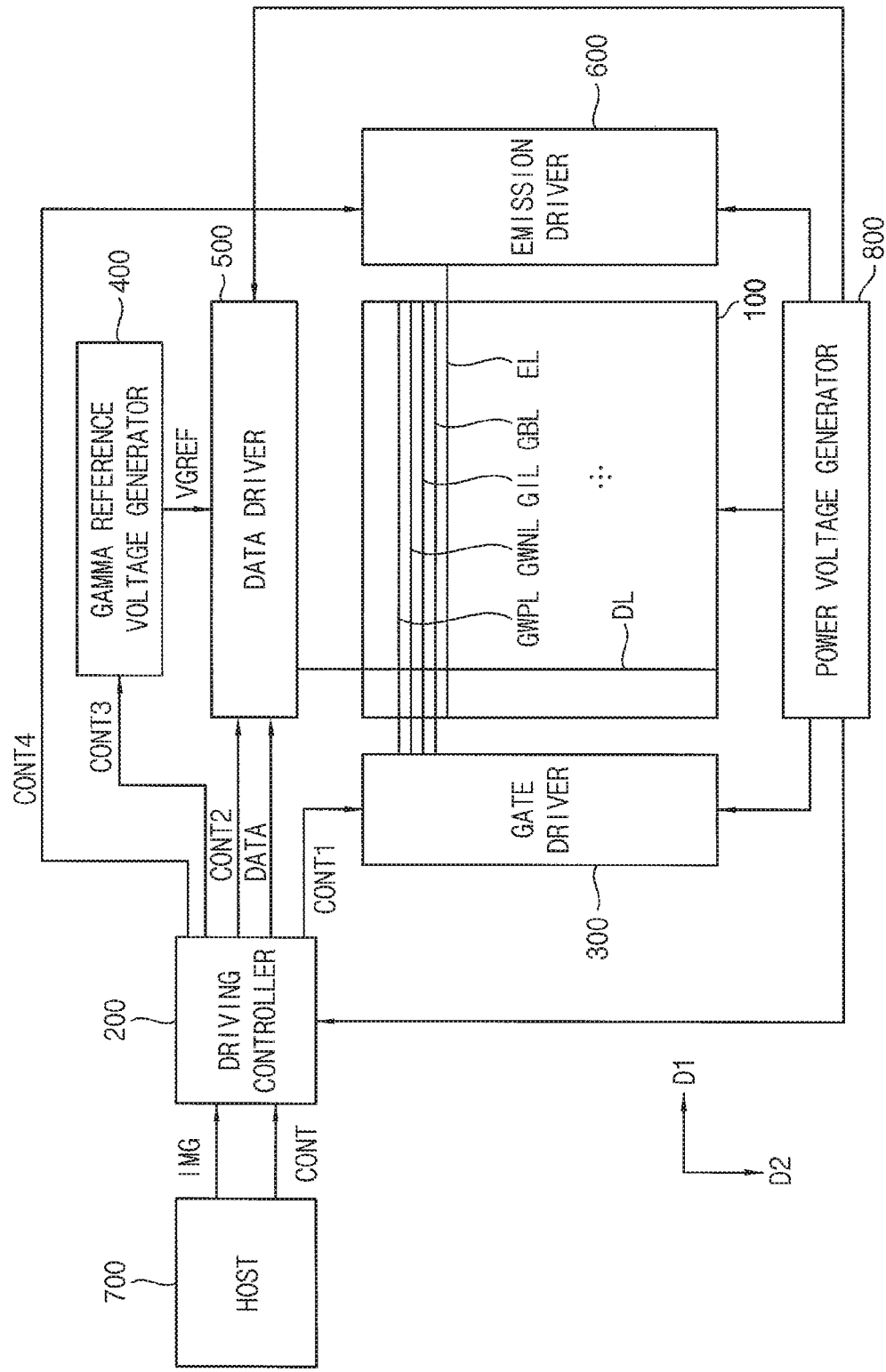
FIG. 10 is a block diagram illustrating a display apparatus according to an exemplary embodiment of the present inventive concept.
Figure 11:
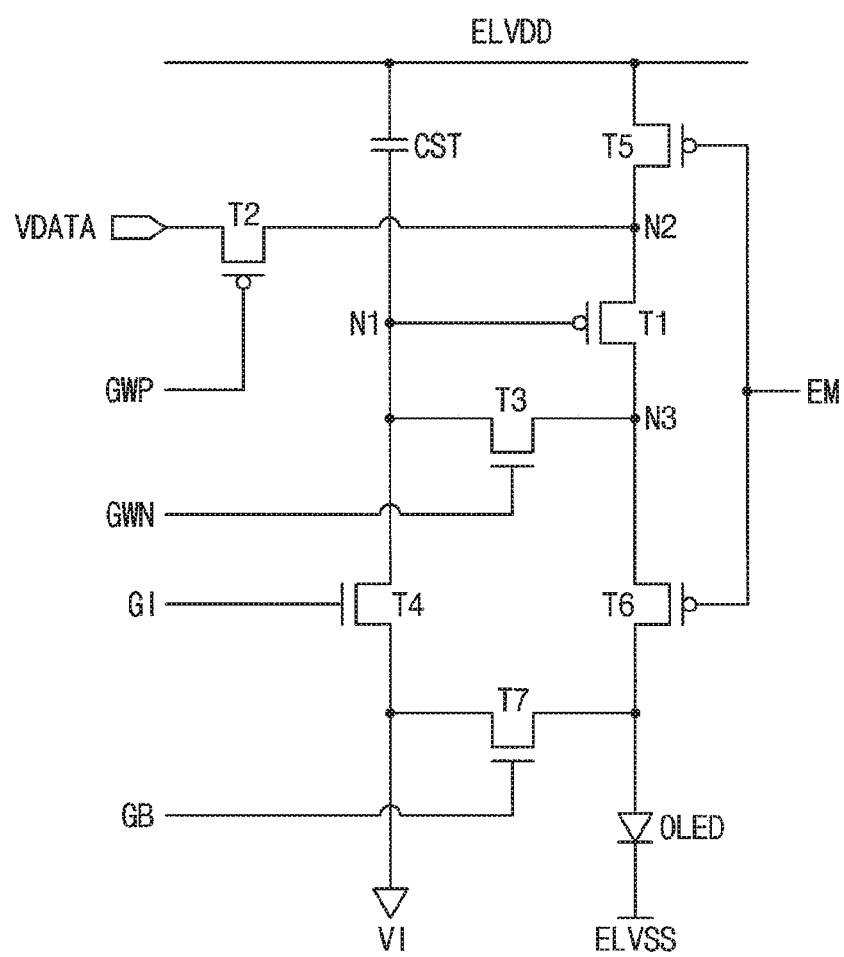
FIG. 11 is a circuit diagram illustrating a pixel of a display panel of FIG. 10 according to an exemplary embodiment of the present inventive concept.
Figure 12:
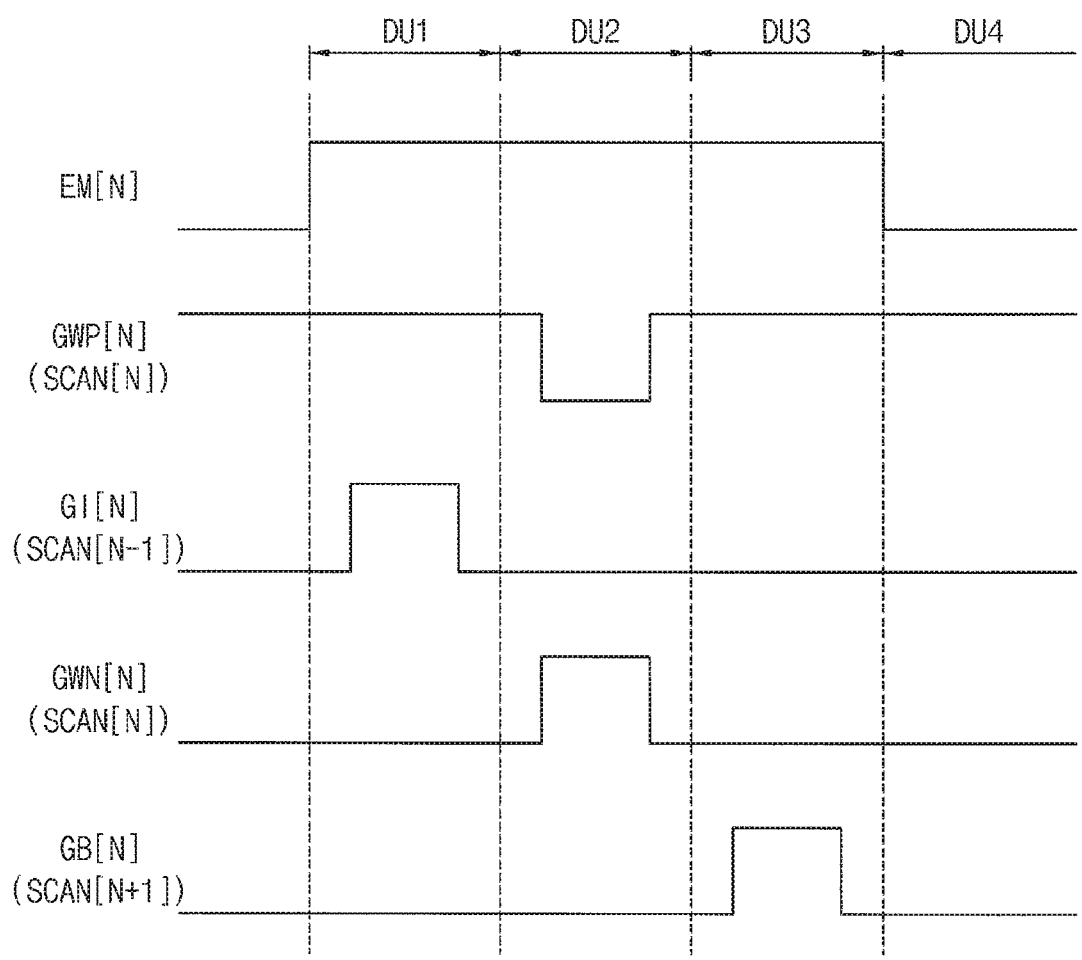
FIG. 12 is a timing diagram illustrating input signals applied to the pixel of FIG. 11 according to an exemplary embodiment of the present inventive concept.
Figure 13:
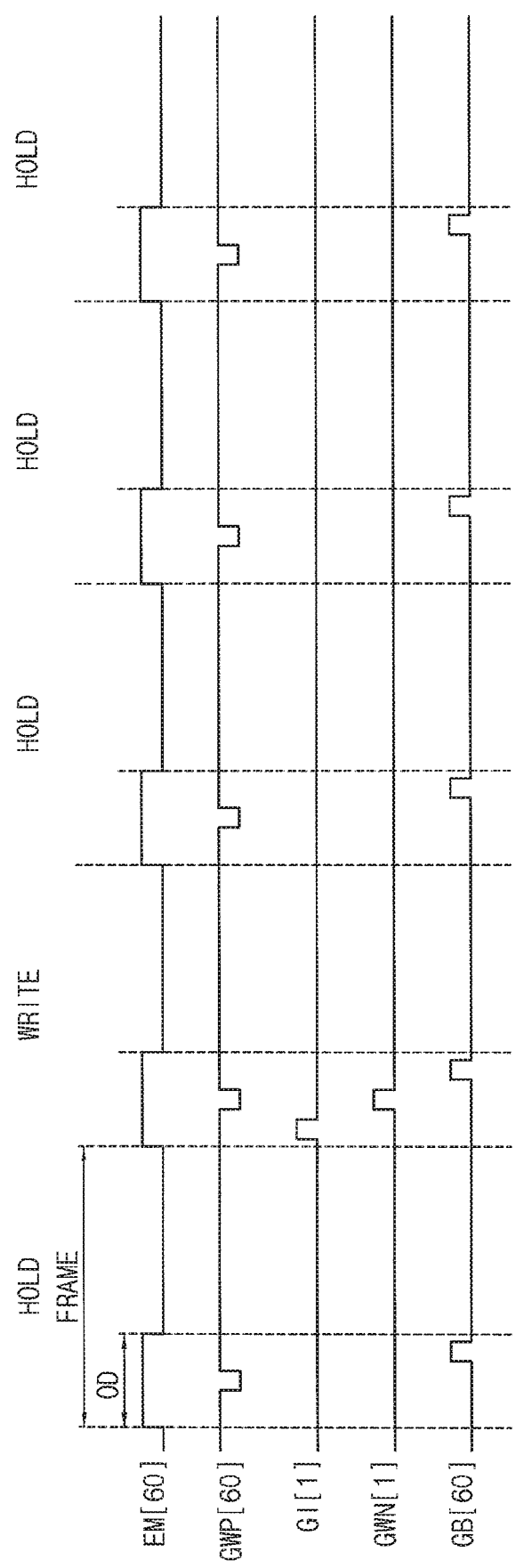
FIG. 13 is a timing diagram illustrating input signals applied to the pixel of the display panel of FIG. 11 in a low frequency driving mode according to an exemplary embodiment of the present inventive concept.

FIG. 10 is a block diagram illustrating a display apparatus according to an exemplary embodiment of the present inventive concept. FIG. 11 is a circuit diagram illustrating a pixel of a display panel of FIG. 10 according to an exemplary embodiment of the present inventive concept. FIG. 12 is a timing diagram illustrating input signals applied to the pixel of FIG. 11 according to an exemplary embodiment of the present inventive concept. FIG. 13 is a timing diagram illustrating input signals applied to the pixel of the display panel of FIG. 11 in a low frequency driving mode according to an exemplary embodiment of the present inventive concept.

The display apparatus and the method of driving the display panel according to the present exemplary embodiment is substantially the same as the display apparatus and the method of driving the display panel of the exemplary embodiment described with reference to FIGS. 1 to 7, except for a structure of the display panel, a signal generated by the gate driver, and an emission driver. Thus, the same reference numerals will be used to refer to the same or like parts as those described in the exemplary embodiment of FIGS. 1 to 7 and any repetitive explanation concerning the above elements will be omitted.

Referring to FIGS. 2 to 7 and 10 to 13, the display apparatus includes the display panel 100 and the display panel driver. The display panel driver includes the driving controller 200, the gate driver 300, the gamma reference voltage generator 400, the data driver 500, and an emission driver 600. The display apparatus may further include the host 700. The display apparatus may further include the power voltage generator 800.

The display panel 100 includes a plurality of gate lines GWPL, GWNL, GIL and GBL, a plurality of data lines DL, a plurality of emission lines EL, and a plurality of pixels electrically connected to the gate lines GWPL, GWNL, GIL, and GBL, the data lines DL and the emission lines EL. The gate lines GWPL, GWNL, GIL, and GBL may extend in the first direction D1, the data lines DL may extend in the second direction D2 crossing the first direction D1, and the emission lines EL may extend in the first direction D1.

The gate driver 300 generates gate signals driving the gate lines GWPL, GWNL, GIL, and GBL in response to the first control signal CONT1 received from the driving controller 200. The gate driver 300 may sequentially output the gate signals to the gate lines GWPL, GWNL, GIL, and GBL.

The emission driver 600 generates emission signals to drive the emission lines EL in response to a fourth control signal CONT4 received from the driving controller 200. The emission driver 600 may output the emission signals to the emission lines EL.

The display panel 100 may include a plurality of pixels. Each of the pixels may include the organic light emitting diode OLED.

The pixel receives a data write gate signal GWP and GWN, a data initialization gate signal GI, an organic light emitting element initialization signal GB, a data voltage VDATA, and an emission signal EM and the organic light emitting element OLED of the pixel emits light corresponding to the level of the data voltage VDATA to display the image.

In the present exemplary embodiment, the pixel may include a switching element of a first type and a switching element of a second type different from the first type. For example, the switching element of the first type may be a polysilicon thin film transistor. For example, the switching element of the first type may be a low temperature polysilicon (LTPS) thin film transistor. For example, the switching element of the second type may be an oxide thin film transistor. For example, the switching element of the first type may be a P-type transistor and the switching element of the second type may be an N-type transistor.

For example, the data write gate signal may include a first data write gate signal GWP and a second data write gate signal GWN. The first data write gate signal GWP may be applied to the P-type transistor so that the first data write gate signal GWP has an activation signal of a low level corresponding to a data writing timing. The second data write gate signal GWN may be applied to the N-type transistor so that the second data write gate signal GWN has an activation signal of a high level corresponding to the data writing timing.

At least one of the pixels may include first to seventh pixel switching elements T1 to T7, a storage capacitor CST, and the organic light emitting element OLED.

The first pixel switching element T1 includes a control electrode connected to a first node N1, an input electrode connected to a second node N2 and an output electrode connected to a third node N3.

For example, the first pixel switching element T1 may be a polysilicon thin film transistor. For example, the first pixel switching element T1 may be a P-type thin film transistor. The control electrode of the first pixel switching element T1 may be a gate electrode, the input electrode of the first pixel switching element T1 may be a source electrode, and the output electrode of the first pixel switching element T1 may be a drain electrode.

The second pixel switching element T2 includes a control electrode to which the first data write gate signal GWP is applied, an input electrode to which the data voltage VDATA is applied, and an output electrode connected to the second node N2.

For example, the second pixel switching element T2 may be a polysilicon thin film transistor. For example, the second pixel switching element T2 may be a P-type thin film transistor. The control electrode of the second pixel switching element T2 may be a gate electrode, the input electrode of the second pixel switching element T2 may be a source electrode, and the output electrode of the second pixel switching element T2 may be a drain electrode.

The third pixel switching element T3 includes a control electrode to which the second data write gate signal GWN is applied, an input electrode connected to the first node N1, and an output electrode connected to the third node N3.

For example, the third pixel switching element T3 may be an oxide thin film transistor. For example, the third pixel switching element T3 may be an N-type thin film transistor. The control electrode of the third pixel switching element T3 may be a gate electrode, the input electrode of the third pixel switching element T3 may be a source electrode, and the output electrode of the third pixel switching element T3 may be a drain electrode.

The fourth pixel switching element T4 includes a control electrode to which the data initialization gate signal GI is applied, an input electrode to which an initialization voltage VI is applied, and an output electrode connected to the first node N1.

For example, the fourth pixel switching element T4 may be an oxide thin film transistor. For example, the fourth pixel switching element T4 may be an N-type thin film transistor. The control electrode of the fourth pixel switching element T4 may be a gate electrode, the input electrode of the fourth pixel switching element T4 may be a source electrode, and the output electrode of the fourth pixel switching element T4 may be a drain electrode.

The fifth pixel switching element T5 includes a control electrode to which the emission signal EM is applied, an input electrode to which a high power voltage ELVDD is applied, and an output electrode connected to the second node N2.

For example, the fifth pixel switching element T5 may be a polysilicon thin film transistor. For example, the fifth pixel switching element T5 may be a P-type thin film transistor. The control electrode of the fifth pixel switching element T5 may be a gate electrode, the input electrode of the fifth pixel switching element T5 may be a source electrode, and the output electrode of the fifth pixel switching element T5 may be a drain electrode.

The sixth pixel switching element T6 includes a control electrode to which the emission signal EM is applied, an input electrode connected to the third node N3, and an output electrode connected to an anode electrode of the organic light emitting element OLED.

For example, the sixth pixel switching element T6 may be a polysilicon thin film transistor. For example, the sixth pixel switching element T6 may be a P-type thin film transistor. The control electrode of the sixth pixel switching element T6 may be a gate electrode, the input electrode of the sixth pixel switching element T6 may be a source electrode, and the output electrode of the sixth pixel switching element T6 may be a drain electrode.

The seventh pixel switching element T7 includes a control electrode to which the organic light emitting element initialization gate signal GB is applied, an input electrode to which the initialization voltage VI is applied, and an output electrode connected to the anode electrode of the organic light emitting element OLED.

For example, the seventh pixel switching element T7 may be an oxide thin film transistor. For example, the seventh pixel switching element T7 may be an N-type thin film transistor. The control electrode of the seventh pixel switching element T7 may be a gate electrode, the input electrode of the seventh pixel switching element T7 may be a source electrode, and the output electrode of the seventh pixel switching element T7 may be a drain electrode.

The storage capacitor CST includes a first electrode to which the high power voltage ELVDD is applied and a second electrode connected to the first node N1.

The organic light emitting element OLED includes the anode electrode and a cathode electrode to which a low power voltage ELVSS is applied.

In FIG. 12, during a first duration DU1, the first node N1 and the storage capacitor CST are initialized in response to the data initialization gate signal GI. During a second duration DU2, a threshold voltage |VTH| of the first pixel switching element T1 is compensated and the data voltage VDATA of which the threshold voltage |VTH| is compensated is written to the first node N1 in response to the first and second data write gate signals GWP and GWN. During a third duration DU3, the anode electrode of the organic light emitting element OLED is initialized in response to the organic light emitting element initialization gate signal GB. During a fourth duration DU4, the organic light emitting element OLED emits the light in response to the emission signal EM so that the display panel 100 displays the image.

Although an emission off duration of the emission signal EM corresponds to the first to third durations DU1, DU2, and DU3 in the present exemplary embodiment, the present inventive concept is not limited thereto. The emission off duration of the emission signal EM may be set to include a data writing duration, e.g., the second duration DU2. The emission off duration of the emission signal EM may be longer than a sum of the first to third durations DU1, DU2, and DU3.

During the first duration DU1, the data initialization gate signal GI may have an active level. For example, the active level of the data initialization gate signal GI may be a high level. When the data initialization gate signal GI has the active level, the fourth pixel switching element T4 is turned on so that the initialization voltage VI may be applied to the first node N1. The data initialization gate signal GI[N] of a present stage may be generated based on a scan signal SCAN[N−1] of a previous stage.

During the second duration DU2, the first data write gate signal GWP and the second data write gate signal GWN may have an active level. For example, the active level of the first data write gate signal GWP may be a low level and the active level of the second data write gate signal GWN may be a high level. When the first data write gate signal GWP and the second data write gate signal GWN have the active level, the second pixel switching element T2 and the third pixel switching element T3 are turned on. In addition, the first pixel switching element T1 is turned on in response to the initialization voltage VI. The first data write gate signal GWP[N] of the present stage may be generated based on a scan signal SCAN[N] of the present stage. The second data write gate signal GWN[N] of the present stage may be generated based on the scan signal SCAN[N] of the present stage.

A voltage which is a subtraction of the absolute value of the threshold voltage |VTH| of the first pixel switching element T1 from the data voltage VDATA may be charged at the first node N1 along a path generated by the first to third pixel switching elements T1, T2, and T3.

During the third duration DU3, the organic light emitting element initialization signal GB may have an active level. For example, the active level of the organic light emitting element initialization signal GB may be a high level. When the organic light emitting element initialization signal GB has the active level, the seventh pixel switching element T7 is turned on so that the initialization voltage VI may be applied to the anode electrode of the organic light emitting element OLED. The organic light emitting element initialization signal GB [N] of the present stage may be generated based on a scan signal SCAN[N+1] of a next stage.

During the fourth duration DU4, the emission signal EM may have an active level. The active level of the emission signal EM may be a low level. When the emission signal EM has the active level, the fifth pixel switching element T5 and the sixth pixel switching element T6 are turned on. In addition, the first pixel switching element T1 is turned on by the data voltage VDATA.

A driving current flows through the fifth pixel switching element T5, the first pixel switching element T1, and the sixth pixel switching element T6 to drive the organic light emitting element OLED. An intensity of the driving current may be determined by the level of the data voltage VDATA. A luminance of the organic light emitting element OLED is determined by the intensity of a driving current ISD. The driving current ISD flowing through a path from the input electrode to the output electrode of the first pixel switching element T1 is determined according to Equation 1 below.

$$ISD = \frac{1}{2}\mu Cox \frac{W}{L}(VSG - |VTH|)^2 \qquad \text{[Equation 1]}$$

In Equation 1, μ is a mobility of the first pixel switching element T1. Cox is a capacitance per unit area of the first pixel switching element T1. W/L is a width to length ratio of the first pixel switching element T1. VSG is a voltage between the input electrode N2 of the first pixel switching element T1 and the first node N1 of the first pixel switching element T1. |VTH| is the threshold voltage of the first pixel switching element T1.

A voltage VG of the first node N1 after the compensation of the threshold voltage |VTH| during the second duration DU2 may be represented according to Equation 2 below.

$$VG = VDATA - |VTH| \qquad \text{[Equation 2]}$$

When the organic light emitting element OLED emits the light during the fourth duration DU4, a driving voltage VOV and the driving current ISD may be represented according to Equations 3 and 4 below. In Equation 3, VS is a voltage of the second node N2.

$$VOV = VS - VG - |VTH| = \qquad \text{[Equation 3]}$$
$$ELVDD - (VDATA - |VTH|) - |VTH| = ELVDD - VDATA$$

$$ISD = \frac{1}{2}\mu Cox \frac{W}{L}(ELVDD - VDATA)^2 \qquad \text{[Equation 4]}$$

The threshold voltage |VTH| is compensated during the second duration DU2, so that the driving current ISD may be determined regardless of the threshold voltage |VTH| of the first pixel switching element T1 when the organic light emitting element OLED emits the light during the fourth duration DU4.

In the present exemplary embodiment, when the image displayed on the display panel 100 is a static image or the display panel is operated in Always On Mode, a driving frequency of the display panel 100 may be decreased to reduce power consumption. When all of the switching elements of the pixel of the display panel 100 are polysilicon thin film transistors, a flicker may be generated due to a leakage current of the pixel switching element in the low frequency driving mode. Thus, some of the pixel switching elements may be designed using oxide thin film transistors. In the present exemplary embodiment, the third pixel switching element T3, the fourth pixel switching element T4, and the seventh pixel switching element T7 may be oxide thin film transistors. The first pixel switching element T1, the second pixel switching element T2, the fifth pixel switching element T5, and the sixth pixel switching element T6 may be polysilicon thin film transistors.

The display panel 100 may be driven in a normal driving mode in which the display panel 100 is driven in a normal driving frequency and in a low frequency driving mode in which the display panel 100 is driven in a frequency less than the normal driving frequency.

For example, when the input image data represent a video image, the display panel 100 may be driven in the normal driving mode. For example, when the input image data represent a static image, the display panel may be driven in the low frequency driving mode. For example, when the display apparatus is operated in the Always On Mode, the display panel may be driven in the low frequency driving mode.

In the present exemplary embodiment, the second data write gate signal GWN and the data initialization gate signal GI may have a first frequency in the low frequency driving mode. The first frequency may be the frequency of the low frequency driving mode. In contrast, the first data write gate signal GWP, the emission signal EM, and the organic light emitting element initialization gate signal GB may have a second frequency greater than the first frequency. The second frequency may be the normal frequency of the normal driving mode. In FIG. 13, the first frequency is 1 Hz and the second frequency is 60 Hz.

The emission signal EM in the frame may include an emission off duration OD when the emission signal EM has the inactive level and an emission on duration when the emission signal EM has the active level.

The driving controller 200 may include the receiver 220, the frequency determiner 240, the signal generator 260, and the data compensator 280.

The frequency determiner 240 may determine the driving frequency FR of the display apparatus based on the input image data IMG. When the input image data IMG represents a video image, the driving frequency FR may be relatively high. When the input image data IMG represents a still image, the driving frequency FR may be relatively low.

The frequency determiner 240 may determine a low frequency driving mode and a normal driving mode based on the input image data IMG. For example, when the input image data IMG represents a video image, the frequency determiner 240 may drive the display apparatus in the normal driving mode. For example, when the input image data IMG represents a still image, the frequency determiner 240 may drive the display apparatus in the low frequency driving mode.

In the power reducing mode, the power voltage generator 800 may not output at least one of the power voltages. Alternatively, in the power reducing mode, the power voltage generator 800 may not output all of the power voltages. The operation of the receiver 220 may be deactivated in the power reducing mode. For example, the input buffers IB1 to IBX of the receiver 220 may be turned off in the power reducing mode. The operation of the data driver 500 may be deactivated in the power reducing mode. For example, the output buffers OB1 to OBN of the buffer 580 may be turned off in the power reducing mode.

According to the present exemplary embodiment, the display panel 100 includes the switching element of the first type and the switching element of the second type so that power consumption may be reduced and display quality of the display panel may be enhanced in the low frequency driving mode.

In addition, at least one of the receiver 220 of the driving controller 200, the output buffer OB of the data driver 500, and the power voltage generator 800 is operated in the power reducing mode during the holding frame of the low frequency driving mode so that the power consumption of the display apparatus may be further reduced.

According to exemplary embodiments of the present inventive concept as explained above, the display quality of the display panel may be enhanced and the power consumption of the display apparatus may be reduced.

While the present inventive concept has been shown and described with reference to exemplary embodiments thereof, it will be apparent to those of ordinary skill in the art that that various changes in form and details may be made thereto with departing from the spirit and scope of the present inventive concept as set forth by the following claims.

What is claimed is:

1. A display apparatus comprising: a display panel configured to display an image based on input image data; a driving controller configured to determine a low frequency driving mode and a normal driving mode based on the input image data; a gate driver configured to output a gate signal to the display panel; a data driver configured to output a data voltage to the display panel; and a power voltage generator configured to output power voltages to the driving controller, the gate driver, and the data driver, wherein the driving controller is configured to generate a writing frame in which data is written in a pixel of the display panel and a holding frame in which the written data is maintained without writing data in the pixel in the low frequency driving mode, and wherein the driving controller is further configured in response to receipt of a power reducing signal, the power reducing signal having an active level, to operate at least one of the driving controller, the data driver, and the power voltage generator in a power reducing mode during the holding frame; the driving controller including a frequency determiner configured to determine a driving frequency and the power reducing mode based on the input image data, the frequency determiner generating the power reducing signal and outputting the power reducing signal to at least the power voltage generator.

2. The display apparatus of claim 1, wherein the driving controller further comprises:
   a receiver configured to receive the input image data and an input control signal;
   a signal generator configured to generate a gate control signal for controlling the gate driver and a data control signal for controlling the data driver based on the driving frequency and the input control signal; and
   a data compensator configured to generate a data signal based on the driving frequency and the input control signal.

3. The display apparatus of claim 2, wherein an input buffer of the receiver is configured to be turned off in the power reducing mode.

4. The display apparatus of claim 1, wherein the power voltage generator is configured not to output at least one of the power voltages in the power reducing mode.

5. The display apparatus of claim 4, wherein the power voltage generator is configured not to output some of the power voltages in a first power reducing mode, and
   wherein the power voltage generator is configured not to output all of the power voltages in a second power reducing mode.

6. The display apparatus of claim 5, wherein the power voltage generator comprises:

a first voltage generator configured to generate an oscillator voltage for operating an oscillator generating a clock signal of the driving controller;
a second voltage generator configured to generate a logic voltage for operating the driving controller;
a third voltage generator configured to generate a memory voltage for operating a memory used by the driving controller;
a fourth voltage generator configured to generate a signal transmitting voltage for transmitting a signal between the driving controller and the data driver; and
a fifth voltage generator configured to generate a data power voltage for operating the data driver.

7. The display apparatus of claim 6, wherein a first switch connected to the first voltage generator, a third switch connected to the third voltage generator, and a fifth switch connected to the fifth voltage generator are configured to be open, and a second switch connected to the second voltage generator and a fourth switch connected to the fourth voltage generator are configured to be closed in the first power reducing mode.

8. The display apparatus of claim 6, wherein a first switch connected to the first voltage generator, a second switch connected to the second voltage generator, a third switch connected to the third voltage generator, a fourth switch connected to the fourth voltage generator, and a fifth switch connected to the fifth voltage generator are configured to be open in the second power reducing mode.

9. The display apparatus of claim 1, wherein an output buffer of the data driver is configured to be turned off in the power reducing mode.

10. The display apparatus of claim 9, wherein the data driver comprises:
a plurality of current sources connected to one another in parallel;
a plurality of current switches respectively connected to the plurality of current sources in series;
a first transistor connected to the plurality of current switches; and
a second transistor connected to the first transistor and the output buffer,
wherein the plurality of current switches are configured to be open in the power reducing mode.

11. The display apparatus of claim 1, wherein the driving controller is configured to generate a synchronizing signal having an active pulse in the holding frame before the writing frame in the power reducing mode.

12. The display apparatus of claim 1, wherein the driving controller is configured to generate a synchronizing signal having a plurality of active pulses in the holding frame before the writing frame in the power reducing mode.

13. The display apparatus of claim 1, wherein the pixel comprises a switching element of a first type and a switching element of a second type different from the first type.

14. The display apparatus of claim 13, wherein the switching element of the second type is configured to be driven in a low driving frequency and the switching element of the first type is configured to be driven in a first driving frequency greater than the low driving frequency in the low frequency driving mode.

15. The display apparatus of claim 14, wherein the switching element of the first type and the switching element of the second type are configured to be driven in a normal driving frequency greater than the low driving frequency in the normal driving mode.

16. The display apparatus of claim 13, wherein the switching element of the first type is a polysilicon thin film transistor, and
wherein the switching element of the second type is an oxide thin film transistor.

17. The display apparatus of claim 16, wherein the switching element of the first type is a P-type transistor, and
wherein the switching element of the second type is an N-type transistor.

18. The display apparatus of claim 17, wherein the pixel comprises:
a first pixel switching element comprising a control electrode connected to a first node, an input electrode connected to a second node, and an output electrode connected to a third node;
a second pixel switching element comprising a control electrode configured to receive a first data write gate signal, an input electrode configured to receive the data voltage, and an output electrode connected to the second node;
a third pixel switching element comprising a control electrode configured to receive a second data write gate signal, an input electrode connected to the first node, and an output electrode connected to the third node;
a fourth pixel switching element comprising a control electrode configured to receive a data initialization gate signal, an input electrode configured to receive an initialization voltage, and an output electrode connected to the first node;
a fifth pixel switching element comprising a control electrode configured to receive an emission signal, an input electrode configured to receive a high power voltage, and an output electrode connected to the second node;
a sixth pixel switching element comprising a control electrode configured to receive the emission signal, an input electrode connected to the third node, and an output electrode connected to an anode electrode of an organic light emitting element;
a seventh pixel switching element comprising a control electrode configured to receive an organic light emitting element initialization gate signal, an input electrode configured to receive the initialization voltage, and an output electrode connected to the anode electrode of the organic light emitting element;
a storage capacitor comprising a first electrode configured to receive the high power voltage and a second electrode connected to the first node; and
the organic light emitting element comprising the anode electrode connected to the output electrode of the sixth switching element and a cathode electrode configured to receive a low power voltage.

19. The display apparatus of claim 18, wherein the first pixel switching element, the second pixel switching element, the fifth pixel switching element, and the sixth pixel switching element are polysilicon thin film transistors, and
wherein the third pixel switching element and the fourth pixel switching element are oxide thin film transistors.

20. A method of driving a display panel, the method comprising: determining a low frequency driving mode and a normal driving mode based on input image data using a driving controller; outputting a gate signal to the display panel according to the low frequency driving mode and the normal driving mode using a gate driver; and outputting a data voltage to the display panel according to the low frequency driving mode and the normal driving mode using a data driver, wherein the driving controller is configured to generate a writing frame in which data is written in a pixel of the display panel and a holding frame in which the written data is maintained without writing data in the pixel in the low frequency driving mode, and wherein the driving controller is further configured in response to receipt of a power reducing signal, the power reducing signal having an active level, to operate the driving controller, the data driver, and a power voltage generator in a power reducing mode during the holding frame; the driving controller including a frequency determiner configured to determine a driving frequency and the power reducing mode based on the input image data, the frequency determiner generating the power reducing signal and outputting the power reducing signal to at least the power voltage generator.

* * * * *